United States Patent [19]

Yamaoka et al.

[11] Patent Number: 4,474,868

[45] Date of Patent: Oct. 2, 1984

[54] PHOTO POLYMERIZATION INITIATOR COMPOSITIONS HAVING HIGH SENSITIVITY

[75] Inventors: Tsuguo Yamaoka; Kenichi Koseki; Yoshitaka Goto, all of Chiba, Japan

[73] Assignee: Nippon Oil and Fats Co., Ltd., Tokyo, Japan

[21] Appl. No.: 530,168

[22] Filed: Sep. 7, 1983

[30] Foreign Application Priority Data

Sep. 7, 1982 [JP] Japan .................. 57-155610

[51] Int. Cl.$^3$ .............................. G03C 1/68
[52] U.S. Cl. .............................. 430/281; 204/159.18; 204/159.22; 204/159.23; 430/913; 430/916; 430/921; 430/922; 502/159; 502/160
[58] Field of Search ............... 502/159, 160; 204/159.18, 159.22, 159.23; 430/281, 913, 916, 921, 922

[56] References Cited

U.S. PATENT DOCUMENTS 3,926,643 12/1975 Chang .................. 430/922
4,175,263 12/1979 Priddy .................. 502/160
4,271,260 6/1981 Abele et al. .................. 430/916

Primary Examiner—Jack P. Brammer
Attorney, Agent, or Firm—Sughrue, Mion, Zinn, Macpeak & Seas

[57] ABSTRACT

A photo polymerization initiator composition is disclosed. The composition is comprised of an organic peroxide and a salt selected from the group consisting of pyrylium salts, thiapyrylium salts and selenopyrylium salts represented by the general formula (I):

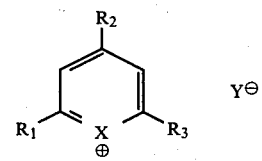

the substituents are defined within the specification. By utilizing the disclosed photo polymerization initiator composition, it is possible to obtain high sensitivity even in the visible range of light.

20 Claims, No Drawings

PHOTO POLYMERIZATION INITIATOR COMPOSITIONS HAVING HIGH SENSITIVITY

FIELD OF THE INVENTION

The present invention relates to photo polymerization initiator compositions for polymerizing ethylenically unsaturated compounds and, in greater detail, to photo polymerization initiator compositions having high sensitivity which are sensitive to a small amount of exposure from ultraviolet rays and visible rays and which can be used in connection with a laser.

BACKGROUND OF THE INVENTION

It is well known that monomers, dimers, trimers, oligomers and prepolymers which have unsaturated bonds in the molecule cause photo polymerization in a presence of a photo polymerization initiator. Further, this phenomenon has been widely utilized in photo polymerization type photo-polymers or photoresists used for producing printing plates, printed base plates or I.C., etc.

Useful photo polymerization initiators include various substances which have been found to be practical. For example, there are benzoin compounds such as benzoin, benzoin methyl ether, or benzoin ethyl ether, etc., carbonyl compounds such as benzil, benzophenone, acetophenone or Michler's ketone, etc., azo compounds such as azobisisobutyronitrile or azodibenzoyl, etc., sulfur compounds such as dibenzothiazolyl sulfide or tetraethylthiuram disulfide, etc., halogen compounds such as carbon tetrabromide or tribromophenyl sulfone, etc., and 1,2-benzanthraquinone, etc.

However, these photo polymerization initiators are not sufficiently satisfactory. When they are used for polymerization of various ethylenically unsaturated compounds, they do not always have good sensitivity as photo-polymers.

Further, in recent years, methods of forming images with laser have been examined. There has already been some practical application in the field of laser direct plate making in the production of printing plates, laser facsimile and holography, etc. Light-sensitive materials for laser used in such cases include silver salt light-sensitive materials, electrophotographic materials, photochromic materials and photo-polymers, etc. The photo-polymers have a very low sensitivity as compared with silver salt light-sensitive materials and electrophotographic materials, and, further, their sensitive wavelength range is from ultraviolet to ultrashort visible rays. For example, when monochromatic light of Ar+ laser having the wavelength of 488 nm is used, the silver salt film (Kodalithortho Film 2556 type 3) requires an energy amount of 0.0205 mJ/cm², while the photopolymer (Kodak polymatic Lithoplate LN-L) requires an energy amount of 7,000 mJ/cm². Further, if ultraviolet rays of the wavelength 351/364 nm are used, the photo-polymer requires an energy amount of 100 mJ/cm².

As described above, the prior photo-polymers are not satisfactory with respect to both sensitivity and their sensitive wavelength range, and they are, particularly, unsuitable as light-sensitive materials for visible light laser.

SUMMARY OF THE INVENTION

The present inventors have found that combinations of organic peroxides and pyrylium salts have a remarkably excellent photo polymerization initiating ability even in the visible light range and have high sensitivity near the silver salt light-sensitive materials.

The present invention provides photo polymerization initiator compositions comprising one or more organic peroxide and one or more pyrylium salt, thiapyrylium salt or selenopyrylium salt represented by the general formula (I):

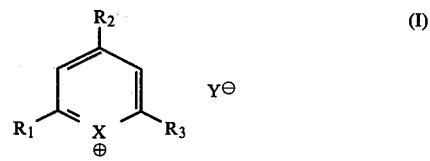

wherein $R_1$, $R_2$ and $R_3$ each represents a hydrogen atom, an alkyl group, a haloalkyl group, an ethylenyl group, a styryl group, an alkoxy group, a phenyl group, a naphthyl group, an alkylphenyl group, an alkoxyphenyl group, a hydroxyphenyl group, a halophenyl group, a nitrophenyl group, an aminophenyl group, a nitro group, an amino group or a hydroxyl group, X represents an oxygen atom, a sulfur atom or a selenium atom, and Y represents an anion functional group.

Moreover, the present invention provides photo polymerization initiator compositions which comprise one or more of binders, for example, a polymer containing repeating unit of N-vinylpyrrolidone, etc., in addition to the above-described composition.

DETAILED DESCRIPTION OF THE INVENTION

The organic peroxides used in the present invention include nearly all organic compounds having one or more oxygen-oxygen bond in the molecule. Examples of them include methyl ethyl ketone peroxide, cyclohexanone peroxide, 3,3,5-trimethylcyclohexanone peroxide, methylcyclohexanone peroxide, acetylacetone peroxide, 1,1-bis(tertiary butyl peroxy)-3,3,5-trimethylcyclohexane, 1,1-bis(tertiary butyl peroxy)cyclohexane, n-butyl-4,4-bis(tertiary butyl peroxy)valerate, 2,2-bis(tertiary butyl peroxy)butane, tertiary butyl hydroperoxide, cumene hydroperoxide, diisopropylbenzene hydroperoxide, p-menthane hydroperoxide, 2,5-dimethylhexane-2,5-dihydroperoxide, 1,1,3,3-tetramethylbutyl hydroperoxide, di-tertiary butyl peroxide, tertiary butylcumyl peroxide, dicumyl peroxide, α,α'-bis(tertiary butyl peroxyisopropyl)benzene, 2,5-dimethyl-2,5-di(tertiary butyl peroxy)hexane, 2,5-dimethyl-2,5-di(tertiary butyl peroxy)hexyne-3, acetyl peroxide, isobutyryl peroxide, octanoyl peroxide, decanoyl peroxide, lauroyl peroxide, 3,5,5-trimethylhexanoyl peroxide, peroxysuccinic acid, benzoyl peroxide, 2,4-dichlorobenzoyl peroxide, m-toluoyl peroxide, diisopropyl peroxydicarbonate, di-2-ethylhexyl peroxydicarbonate, di-normal propyl peroxydicarbonate, di-2-ethoxyethyl peroxydicarbonate, dimethoxy-isopropyl peroxycarbonate, di(3-methyl-3-methoxybutyl)peroxydicarbonate, tertiary butyl peroxyacetate, tertiary butyl peroxyisobutyrate, tertiary butyl peroxypivalate, tertiary butyl peroxyneodecanoate, tertiary butyl peroxyoctanoate, tertiary butyl peroxy-3,5,5-trimethylhexanoate, tertiary butyl peroxylaurate, tertiary butyl peroxybenzoate, di-tertiary butyl diperoxyisophthalate, 2,5-dimethyl-2,5-di(benzoylperoxy)hexane, tertiary butyl peroxymaleic acid, and tertiary butyl peroxyisopropylcarbonate, etc.

Among the above organic peroxides, benzoyl group-containing organic peroxides are preferred, for example, tertiary butyl peroxybenzoate, di-tertiary butyl diperoxyisophthalate, 2,5-dimethyl-2,5-di(benzoylperoxy)hexane, benzoyl peroxide, 2,4-dichlorobenzoyl peroxide and m-toluoyl peroxide. Among the benzoyl group-containing organic peroxides, peroxy ester type organic peroxides are particularly preferred, for example, tertiary butyl peroxybenzoate, di-tertiary butyl diperoxyisophthalate and 2,5-dimethyl-2,5-di(benzoylperoxy)hexane.

In the general formula (I) according to the present invention, $R_1$, $R_2$ and $R_3$ each represents a hydrogen atom, an alkyl group (preferably having 1 to 4 carbon atoms, for example, a methyl group, an ethyl group, a propyl group and a butyl group), a haloalkyl group (preferably having 1 to 4 carbon atoms, for example, a chloromethyl group, a chloroethyl group and a chloropropyl group), an ethylenyl group (for example, $\beta,\beta$-bis(4-dimethylaminophenyl)vinylene group), a styryl group (for example, 3,4-diethoxystyryl, 4-dimethylamino-$\beta$-ethylstyryl, 4-dimethylaminostyryl, $\beta$-methyl-4-dimethylaminostyryl, 3,4-diethoxy-$\beta$-ethylstyryl, 4-methoxy-$\beta$-ethylstyryl, 3,4-diethoxy-$\beta$-aminostyryl, 4-dimethylamino-$\beta$-methylstyryl, 4-dimethylamino-$\beta$-methoxystyryl, 4-methoxystyryl, and styryl), an alkoxy group (preferably having 1 to 4 carbon atoms, for example, a methoxy group, an ethoxy group and a butoxy group), a phenyl group, a naphthyl group, an alkylphenyl group (preferably having 7 to 10 carbon atoms, for example, a methylphenyl group, an ethylphenyl group, a propylphenyl group and a butylphenyl group), an alkoxyphenyl group (having preferably 7 to 12 carbon atoms, more preferably 7 to 10 carbon atoms, for example, a methoxyphenyl group, an ethoxyphenyl group, a propoxyphenyl group, a butoxyphenyl group and an amyloxyphenyl group), a hydroxyphenyl group, a halophenyl group (for example, a chlorophenyl group), a dichlorophenyl group and a bromophenyl group), a nitrophenyl group, an aminophenyl group (for example, an aminophenyl and dimethylaminophenyl group), a nitro group, an amino group (for example, an amino group) or a hydroxy group.

Preferably, at least one of the $R_1$, $R_2$ and $R_3$ represents a benzene ring-containing group selected from the group consisting of a styryl group, a phenyl group, a naphthyl group, an alkylphenyl group, an alkoxyphenyl group, a hydroxyphenyl group, a halophenyl group, a nitrophenyl group and an aminophenyl group. More preferably, $R_1$, $R_2$ and $R_3$ each represents the benzene ring-containing group. Particularly preferably, $R_1$, $R_2$ and $R_3$ each represents an alkylphenyl group, an alkoxyphenyl group or a phenyl group.

In the pyrylium salts, thiapyrylium salts and selenopyrylium salts represented by the general formula (I) used in the present invention, examples of anion functional groups represented by Y include perchlorate, fluoroborate, chloroalminate, chloroferrate, sulfur acetate, methosulfate, thiocyanate, sulfate, nitrate, fluoroantimonate, fluorophosphonate, and acetate, etc. Preferably, the anion functional group represented by Y is perchlorate or fluoroborate.

Among the compounds represented by the general formula (I) according to the present invention, thiapyrylium salts (i.e., X is a sulfur atom) are particularly preferred.

In the following, examples of the compounds represented by the general formula (I) are described.
2,4,6-Triphenylpyrylium perchlorate.
4-(4-Methoxyphenyl)-2,6-diphenylpyrylium perchlorate.
2,6-Bis(4-methoxyphenyl)-4-phenylpyrylium perchlorate.
4-(4-Butoxyphenyl)-2,6-diphenylpyrylium perchlorate.
4-(4-Amyloxyphenyl)-2,6-bis(4-ethylphenyl)pyrylium perchlorate.
2,4,6-Triphenylpyrylium fluoroborate.
2,4,6-Triphenylthiapyrylium perchlorate.
4-(4-Methoxyphenyl)-2,6-diphenylthiapyrylium perchlorate.
6-(4-Ethoxyphenyl)-2,4-diphenylthiapyrylium perchlorate.
2,4,6-Tri(4-methoxyphenyl)thiapyrylium perchlorate.
4-(4-Amyloxyphenyl)-2,6-bis(4-ethylphenyl)thiapyrylium perchlorate.
2,4,6-Triphenylthiapyrylium fluoroborate.
2,4,6-Triphenylthiapyrylium sulfate.
4-(4-Methoxyphenyl)-2,6-diphenylthiapyrylium fluoroborate,
2-(4-Amyloxyphenyl)-4,6-diphenylthiapyrylium fluoroborate.
4-(4-Amyloxyphenyl)-2,6-bis(4-methoxyphenyl)thiapyrylium perchlorate.
4-(4-Methoxyphenyl)-2,6-bis(4-ethylphenyl)thiapyrylium perchlorate.
4-(2,4-Dichlorophenyl)-2,6-diphenylpyrylium perchlorate.
2-(3,4-Dichlorophenyl)-4-(4-methoxyphenyl)-6-phenylpyrylium perchlorate.
4-(4-Amyloxyphenyl)-2,6-bis(4-ethylphenyl)pyrylium perchlorate.
2,6-Bis(4-ethylphenyl)-4-(4-methoxyphenyl)pyrylium fluoroborate.
6-(3,4-Diethoxystyryl)-2,4-diphenylpyrylium perchlorate.
6-(4-Dimethylamino-$\beta$-ethylstyryl)-2,4-diphenylpyrylium fluoroborate.
6-(4-Dimethylaminostyryl)-2,4-diphenylpyrylium perchlorate.
6-($\beta$-Methyl-4-dimethylaminostyryl)-2,4-diphenylpyrylium fluoroborate.
6-[$\beta,\beta$-Bis(4-dimethylaminophenyl)vinylene]-2,4-diphenylpyrylium fluoroborate.
4-(4-Dimethylaminophenyl)-2,6-diphenylpyrylium perchlorate.
2,6-Bis(4-ethylphenyl)-4-methoxyphenylthiapyrylium fluoroborate.
4-(4-Butoxyphenyl)-2,6-bis(4-methoxyphenyl)thiapyrylium fluoroborate.
2,6-Bis(4-methoxyphenyl)-4-phenylthiapyrylium perchlorate.
4-(2,4-Dichlorophenyl)-2,6-diphenylthiapyrylium perchlorate.
6-(4-Dimethylaminostyryl)-2,4-diphenylthiapyrylium perchlorate.
2-(3,4-Diethoxystyryl)-4,6-diphenylthiapyrylium perchlorate.
2,6-Bis(4-aminophenyl)-4-(4-methoxyphenyl)thiapyrylium perchlorate.
6-(3,4-Diethoxy-$\beta$-ethylstyryl)-2,4-diphenylpyrylium fluoroborate.
6-(4-Methoxy-$\beta$-ethylstyryl)-2,4-diphenylpyrylium fluoroborate.
2,4,6-Triphenylselenopyrylium perchlorate.

4-(4-Methoxyphenyl)-2,6-diphenylselenopyrylium fluoroborate.
6-(4-Methoxyphenyl)-2,4-diphenylselenopyrylium perchlorate.
4-(4-Ethoxyphenyl)-2,6-diphenylselenopyrylium perchlorate.
6-(3,4-Diethoxy-β-aminostyryl)-2,4-diphenylselenopyrylium fluoroborate.
2,6-Bis(4-ethylphenyl)-4-phenylselenopyrylium perchlorate.
2,4,6-Triphenylthiapyrylium fluoroborate.
2,4,6-Triphenylthiapyrylium fluoroantimonate.
4-(4-Methoxyphenyl)-2,6-diphenylpyrylium fluoroborate.
2,6-Bis(4-methoxyphenyl)-4-phenylpyrylium fluoroborate.
2,6-Bis(4-methoxyphenyl)-4-phenylthiapyrylium fluoroborate.
2,6-Bis(4-methoxyphenyl)-4-phenylthiapyrylium fluoroantimonate.
4-(4-Butoxyphenyl)-2,6-diphenylpyrylium fluoroborate.
4-(4-Butoxyphenyl)-2,6-diphenylthiapyrylium perchlorate.
4-(4-Butoxyphenyl)-2,6-diphenylthiapyrylium fluoroborate.
4-(4-Butoxyphenyl)-2,6-diphenylthiapyrylium fluoroantimonate.
4-(4-Butoxyphenyl)-2,6-diphenylthiapyrylium fluorophosphonate.
2,6-Bis(4-ethylphenyl)-4-(4-amyloxyphenyl)pyrylium fluoroborate.
2,6-Bis(4-ethylphenyl)-4-(4-amyloxyphenyl)thiapyrylium perchlorate.
2,6-Bis(4-ethylphenyl)-4-(4-amyloxyphenyl)thiapyrylium fluoroborate.
2,6-Bis(4-ethylphenyl)-4-(4-amyloxyphenyl)thiapyrylium fluorophosphonate.
6-(4-Ethoxyphenyl)-2,4-diphenylpyrylium perchlorate.
6-(4-Ethoxyphenyl)-2,4-diphenylpyrylium fluoroborate.
6-(4-Ethoxyphenyl)-2,4-diphenylthiapyrylium fluoroborate.
2,4,6-Tri(4-methoxyphenyl)pyrylium perchlorate.
2,4,6-Tri(4-methoxyphenyl)pyrylium fluoroborate.
2,4,6-Tri(4-methoxyphenyl)thiapyrylium fluoroborate.
2,4,6-Tri(4-methoxyphenyl)thiapyrylium fluoroantimonate.
2,6-Bis(4-ethylphenyl)-4-(4-amyloxyphenyl)pyrylium fluoroborate.
2,6-Bis(4-ethylphenyl)-4-(4-amyloxyphenyl)thiapyrylium fluoroborate.
2,6-Bis(4-ethylphenyl)-4-(4-amyloxyphenyl)thiapyrylium fluorophosphonate.
2-(4-Amyloxyphenyl)-4,6-diphenylpyrylium perchlorate.
2-(4-Amyloxyphenyl)-4,6-diphenylpyrylium fluoroborate.
2-(4-Amyloxyphenyl)-4,6-diphenylthiapyrylium perchlorate.
2,6-Bis(4-methoxyphenyl)-4-(4-amyloxyphenyl)pyrylium perchlorate.
2,6-Bis(4-methoxyphenyl)-4-(4-amyloxyphenyl)pyrylium fluoroborate.
2,6-Bis(4-methoxyphenyl)-4-(4-amyloxyphenyl)thiapyrylium fluoroborate.
2,6-Bis(4-ethylphenyl)-4-(4-methoxyphenyl)pyrylium perchlorate.
2,6-Bis(4-ethylphenyl)-4-(4-methoxyphenyl)thiapyrylium fluoroantimonate.
4-(2,4-Dichlorophenyl)-2,6-diphenylpyrylium fluoroborate.
4-(2,4-Dichlorophenyl)-2,6-diphenylthiapyrylium fluoroborate.
4-(2,4-Dichlorophenyl)-2,6-diphenylthiapyrylium fluorophosphonate.
2-(3,4-Dichlorophenyl)-4-(4-methoxyphenyl)-6-phenylpyrylium fluoroborate.
2-(3,4-Dichlorophenyl)-4-(4-methoxyphenyl)-6-phenylthiapyrylium perchlorate.
2-(3,4-Dichlorophenyl)-4-(4-methoxyphenyl)-6-phenylthiapyrylium fluoroborate.
6-(3,4-Diethoxystyryl)-2,4-diphenylpyrylium fluoroborate.
6-(3,4-Diethoxystyryl)-2,4-diphenylthiapyrylium perchlorate.
6-(3,4-Diethoxystyryl)-2,4-diphenylthiapyrylium fluoroborate.
6-(4-Dimethylamino-β-ethylstyryl)-2,4-diphenylpyrylium perchlorate.
6-(4-Dimethylamino-β-ethylstyryl)-2,4-diphenylthiapyrylium fluoroborate.
6-(4-Dimethylamino-β-ethylstyryl)-2,4-diphenylthiapyrylium fluoroantimonate.
6-(4-Dimethylaminostyryl)-2,4-diphenylpyrylium fluoroborate.
6-(4-Dimethylaminostyryl)-2,4-diphenylthiapyrylium fluoroborate.
6-(4-Dimethylamino-β-methylstyryl)-2,4-diphenylpyrylium perchlorate.
6-(4-Dimethylamino-β-methylstyryl)-2,4-diphenylthiapyrylium perchlorate.
6-(4-Dimethylamino-β-methylstyryl)-2,4-diphenylthiapyrylium fluoroborate.
6-[β,β-Bis(4-dimethylaminophenyl)vinylene]-2,4-diphenylpyrylium perchlorate.
6-[β,β-Bis(4-dimethylaminophenyl)vinylene]-2,4-diphenylthiapyrylium perchlorate.
6-[β,β-Bis(4-dimethylaminophenyl)vinylene]-2,4-diphenylthiapyrylium fluoroborate.
6-[β,β-Bis(4-dimethylaminophenyl)vinylene]-2,4-diphenylthiapyrylium fluorophosphonate.
4-(4-Dimethylaminophenyl)-2,6-diphenylpyrylium fluoroborate.
4-(4-Dimethylaminophenyl)-2,6-diphenylthiapyrylium perchlorate.
4-(4-Dimethylaminophenyl)-2,6-diphenylthiapyrylium fluoroborate.
4-(4-Dimethylaminophenyl)-2,6-diphenylthiapyrylium fluoroantimonate.
2,6-Bis(4-methoxyphenyl)-4-(4-butoxyphenyl)pyrylium perchlorate.
2,6-Bis(4-methoxyphenyl)-4-(4-butoxyphenyl)pyrylium fluoroborate.
2,6-Bis(4-methoxyphenyl)-4-(4-butoxyphenyl)thiapyrylium perchlorate.
2,6-Bis(4-aminophenyl)-4-(4-methoxyphenyl)pyrylium perchlorate.
2,6-Bis(4-aminophenyl)-4-(4-methoxyphenyl)pyrylium fluoroborate.
2,6-Bis(4-aminophenyl)-4-(4-methoxyphenyl)thiapyrylium fluoroborate.
2,6-Bis(4-aminophenyl)-4-(4-methoxyphenyl)thiapyrylium fluoroantimonate.
6-(3,4-Diethoxy-β-ethylstyryl)-2,4-diphenylthiapyrylium fluoroborate.

6-(4-Methoxy-β-ethylstyryl)-2,4-diphenylthiapyrylium perchlorate.
6-(4-Methoxy-β-ethylstyryl)-2,4-diphenylthiapyrylium fluoroborate.
6-(4-Methoxyphenyl)-2,4-diphenylpyrylium perchlorate.
6-(4-Methoxyphenyl)-2,4-diphenylpyrylium fluoroborate.
6-(4-Methoxyphenyl)-2,4-diphenylthiapyrylium perchlorate.
6-(4-Methoxyphenyl)-2,4-diphenylthiapyrylium fluoroborate.
4-(4-Ethoxyphenyl)-2,6-diphenylpyrylium fluoroborate.
4-(4-Ethoxyphenyl)-2,6-diphenylthiapyrylium fluoroborate.
6-(3,4-Diethoxy-β-aminostyryl)-2,4-diphenylpyrylium perchlorate.
6-(3,4-Diethoxy-β-aminostyryl)-2,4-diphenylpyrylium fluoroborate.
6-(3,4-Diethoxy-β-aminostyryl)-2,4-diphenylthiapyrylium perchlorate.
6-(3,4-Diethoxy-β-aminostyryl)-2,4-diphenylthiapyrylium fluoroborate.
6-(3,4-Diethoxy-β-aminostyryl)-2,4-diphenylthiapyrylium fluoroantimonate.
2,6-Bis(4-ethylphenyl)-4-phenylpyrylium perchlorate.
2,6-bis(4-ethylphenyl)-4-phenylthiapyrylium perchlorate.
2,6-Bis(4-ethylphenyl)-4-phenylthiapyrylium fluoroborate.
2-(4-Nitrophenyl)-4,6-bis(4-butylphenyl)pyrylium perchlorate.
2-(4-Nitrophenyl)-4,6-bis(4-butylphenyl)pyrylium fluoroborate.
2-(4-Nitrophenyl)-4,6-bis(4-butylphenyl)thiapyrylium perchlorate.
2-(4-Nitrophenyl)-4,6-bis(4-butylphenyl)thiapyrylium fluoroborate.
2-(4-Nitrophenyl)-4,6-bis(4-butylphenyl)thiapyrylium fluoroantimonate.
2,6-Bis(4-methoxyphenyl)-4-methylpyrylium perchlorate.
2,6-Bis(4-methoxyphenyl)-4-methylpyrylium fluoroborate.
2,6-Bis(4-methoxyphenyl)-4-methylthiapyrylium perchlorate.
2,6-Bis(4-methoxyphenyl)-4-methylthiapyrylium fluoroborate.
2-Hydroxy-4,6-bis(4-dimethylaminostyryl)pyrylium perchlorate.
2-Hydroxy-4,6-bis(4-dimethylaminostyryl)pyrylium fluoroborate.
2-Hydroxy-4,6-bis(4-dimethylaminostyryl)thiapyrylium perchlorate.
2-Hydroxy-4,6-bis(4-dimethylaminostyryl)thiapyrylium fluoroborate.
2-Hydroxy-4,6-bis(4-dimethylamino-β-methoxystyryl)thiapyrylium perchlorate.
2-Nitro-4-(4-methoxystyryl)-6-phenylpyrylium perchlorate.
2-Nitro-4-(4-methoxystyryl)-6-phenylpyrylium fluoroborate.
2-Nitro-4-(4-methoxystyryl)-6-phenylthiapyrylium perchlorate.
2-Nitro-4-(4-methoxystyryl)-6-phenylthiapyrylium fluoroborate.
2-Nitro-4-(4-methoxystyryl)-6-phenylthiapyrylium fluoroantimonate.
2-Nitro-4,6-bis(4-dimethylaminostyryl)pyrylium fluoroborate.
2-Nitro-4,6-bis(4-dimethylaminostyryl)thiapyrylium fluoroborate.
2-Amino-4,6-bis(4-butoxyphenyl)pyrylium perchlorate.
2-Amino-4,6-bis(4-butoxyphenyl)pyrylium fluoroborate.
2-Amino-4,6-bis(4-butoxyphenyl)thiapyrylium perchlorate.
2-Amino-4,6-bis(4-butoxyphenyl)thiapyrylium fluoroborate.
2-Amino-4,6-bis(4-methoxy-β-ethylstyryl)thiapyrylium fluoroborate.
4-(4-Dimethylaminostyryl)-6-[β,β-bis(4-dimethylaminophenyl)vinylene]thiapyrylium perchlorate.
2-Methoxy-4-naphthyl-6-styrylthiapyrylium fluoroborate.
2,6-Diphenyl-4-(4-hydroxyphenyl)thiapyrylium fluoroborate.

The photo polymerization initiator compositions of the present invention comprise (A) one or more of the above-described organic peroxides and (B) one or more of the above-described pyrylium salts, thiapyrylium salts and selenopyrylium salts, wherein the ratio by weight of (A):(B) is in the range of 1 to 99:99 to 1, preferably 3 to 95:97 to 5. Excellent effects cannot be obtained in compositions in which the ratio is beyond the above-described range.

The photo polymerization initiator compositions of the present invention may contain one or more binders. Useful binders include any polymers having film forming ability. Examples of them include poly-N-vinylpyrrolidone, polymethyl methacrylate, polystyrene, polyvinyl acetate and copolymers of them. Among them, N-vinylpyrrolidone polymers are particularly preferred with respect to sensitivity.

Polymers containing a repeating unit of N-vinylpyrrolidone include homopolymers of N-vinylpyrrolidone and copolymers of N-vinylpyrrolidone and copolymerizable unsaturated monomers. Examples of unsaturated monomers include acrylic acid esters, methacrylic acid esters, crotonic acid esters, maleic acid esters, fumaric acid esters, itaconic acid esters, acrylamide, acrylonitrile, ethylene, vinyl chloride, vinyl acetate, vinylidene chloride, methyl vinyl ether, methyl vinyl ketone, styrene, vinyl toluene and chlorostyrene, etc. It is possible to use polymers having a molecular weight of 1,000 to 1,000,000, but it is preferred to use those having a molecular weight of 3,000 to 500,000. Further, a preferred ratio of N-vinylpyrrolidone in the copolymers is in a range of 5% by weight or more.

The amount of the polymers containing a repeating unit of N-vinylpyrrolidone is in a range of 1 to 100 parts by weight based on 1 part by weight of the total of the component (A) and the component (B).

The photo polymerization initiator compositions of the present invention are capable of photo-polymerizing almost all polymerizable ethylenically unsaturated compounds within a very short time with ultraviolet rays and visible rays. As such polymerizable ethylenically unsaturated compounds, there are monomers, oligomers and prepolymers which have polymerizable ethylenically unsaturated bonds. Examples of the polymerizable ethylenically unsaturated compounds include unsaturated acids such as acrylic acid, methacrylic acid, itaconic acid, maleic acid and anhydride thereof, phthalic acid and anhydride thereof, or fumaric acid, etc., unsaturated acid esters such as methyl acrylate (or methacrylate), ethyl acrylate (or methacrylate), butyl acrylate (or methacrylate), glycidyl acrylate (or methacrylate), hydroxyethyl acrylate (or methacrylate), dimethyl maleate, diethyl maleate, dimethyl fumarate, pentaerythritol triacrylate (or trimethacrylate), trimethylolpropane triacrylate (or trimethacrylate), ethylene glycol diacrylate (or dimethacrylate) or propylene glycol diacrylate (or dimethacrylate), etc., and styrene, acrylamide, acrylonitrile, N-vinylpyrrolidone, vinyl acetate, other unsaturated polyesters, unsaturated polyethers, unsaturated polyurethane and epoxyacrylate (or methacrylate) compounds, etc.

To one of these polymerizable ethylenically unsaturated compounds or a mixture of two or more of them, the photo polymerization initiator composition of the present invention is added and, if desired, the above-described binders and conventional dyes, pigments, additives or inhibitors, etc., and suitable diluting solvents are added thereto to produce photo-polymerizable compositions.

When the photo polymerization initiator composition consists essentially of the organic peroxides and the compounds represented by the general formula (I) which does not contain the above-described binders, the amount of the photo polymerization initiator composition to be added (i.e., total amount of the organic peroxides and the compounds represented by the general formula (I)) is 0.1 to 40 parts by weight, preferably 0.5 to 30 parts by weight, based on 100 parts by weight of the polymerizable ethylenically unsaturated compounds. When the photo polymerization initiator composition contains the above-described binders, for example, N-vinylpyrrolidone polymers, the amount (i.e., total amount of the organic peroxides, the compounds represented by the general formula (I) and the binders) is 50 to 200 parts by weight based on 100 parts by weight of the polymerizable ethylenically unsaturated compounds.

Further, as diluting solvents, any material can be used, if it dissolves the photo polymerization initiator composition and polymerizable ethylenically unsaturated compounds used. Examples thereof include water, methanol, ethanol, propanol, butanol, acetone, methyl ethyl ketone, methyl isobutyl ketone, methyl cellosolve, ethyl cellosolve, benzene, toluene, xylene, ethyl acetate, butyl acetate, tetrahydrofuran, dioxane, dichloromethane, chloroform, carbon tetrachloride, trichloroethylene, dimethylformamide and dimethyl sulfoxide, etc.

The resulting photo-polymerizable compositions cause a polymerization reaction within a very short time after being irradiated with active rays having a wide range of wavelengths of from ultraviolet rays to visible light. Useful light sources include superhigh-pressure, high-pressure, middle-pressure and low-pressure mercury-vapor lamps, chemical lamps, carbon arc lamps, xenon lamps, metal halide lamps, various laser lamps of visible and ultraviolet rays, fluorescent lamps, tungsten lamps and sunlight, etc.

The photo polymerization initiator compositions of the present invention can be used not only for a conventional photo polymerization reaction, but also in various fields, such as light-hardening coatings, printing inks, adhesives, production of printing plates, and photoresists when producing printed base plates or I.C., etc., and the results obtained with them are excellent. Particularly, since the photo polymerization initiator compositions of the present invention have high sensitivity and wide spectral sensitivity characteristics up to the visible light range, surprisingly excellent effects can be obtained when the light-sensitive materials are subjected to a visible light laser such as Ar+ laser, etc.

In the following, the present invention is illustrated in greater detail with reference to examples and comparative examples. In the examples, all parts are by weight. These examples are set forth as being illustrative and are not intended, in any way, to limit the present invention.

EXAMPLES 1-50

100 parts of pentaerythritol triacrylate were used as a polymerizable ethylenically unsaturated compound, and 100 parts of poly-N-vinylpyrrolidone were used as a binder. To the mixture, the photo polymerization initiator composition of the present invention was added in an amount shown in Table 1, and the mixture was dissolved uniformly in 1,000 parts of methyl cellosolve to prepare a light-sensitive solution.

The resulting light-sensitive solution was applied to an anodically oxidized aluminum plate with a spinner so as to result in a dried film thickness of 1 μm.

The sensitivity test was carried out using each monochromatic light of visible ray (wavelength: 488 nm), ultraviolet ray (wavelength: 365 nm) and laser ray (wavelength: 488 nm). The monochromatic light of the visible ray having 488 nm was obtained using a 500 W xenon lamp as a light source by passing through two filters of Toshiba color glass filters Y-47 and KL-49. Further, the monochromatic light of 365 nm was obtained using a 450 W high-pressure mercury vapor lamp by passing through Toshiba color glass filter UVD 35. As the laser light, a single line of Ar+ laser (2.5 W) having a wavelength of 488 nm was used as a beam having the diameter of 1.25 mm. Using each monochromatic light, the above-described light-sensitive film was exposed. The sensitivity was measured as an integration light energy necessary to completely harden the coating film.

Results are shown in Table 1, wherein all amounts of the photo polymerization initiator compositions are based on 100 parts of pentaerythritol triacrylate.

EXAMPLES 51-59

The sensitivity test was carried out by the same method as in Examples 1-50, except that polymethyl methacrylate, polystyrene or polyvinyl acetate was used as a binder as shown in Table 3 instead of poly-N-vinylpyrrolidone.

Results are shown in Table 3.

COMPARATIVE EXAMPLES 1-14

The same sensitivity test was carried out as in Examples 1-50 using each one of the prior known photo polymerization initiators, organic peroxides, pyrylium salts and thiapyrylium salts instead of the photo polymerization initiator composition of the present invention.

Results are shown in Table 2, wherein all amounts of the photo polymerization initiator are based on 100 parts of pentaerythritol triacrylate.

TABLE 1

Results of Light-Sensitivity Test

| Example | Organic Peroxide (parts) | | Compound of the General Formula (I) (parts) | | Integration Light Energy (mJ/cm²) | | Laser Light λ = 488 nm |
|---|---|---|---|---|---|---|---|
| | | | | | λ = 488 nm | λ = 365 nm | |
| 1 | BPO | 3 | TPT | 2 | 0.069 | 0.270 | 0.075 |
| 2 | PBIF | 4 | TPT | 1.5 | 0.058 | 0.261 | 0.062 |
| 3 | POZ | 2 | TPT | 3 | 0.043 | 0.282 | 0.047 |
| 4 | DCP | 6 | TPT | 4 | 0.035 | 0.205 | 0.035 |
| 5 | PBZ | 4 | TPT | 4 | 0.037 | 0.197 | 0.041 |
| 6 | PXM | 1.5 | TPT | 3 | 0.056 | 0.342 | 0.055 |
| 7 | BPO | 2 | BDT | 2 | 0.097 | 0.376 | 0.089 |
| 8 | PBIF | 5 | BDT | 0.5 | 0.102 | 0.400 | 0.100 |
| 9 | POZ | 3 | BDT | 3 | 0.072 | 0.190 | 0.085 |
| 10 | DCP | 2 | BDT | 2 | 0.063 | 0.233 | 0.071 |
| 11 | PBZ | 1.5 | BDT | 1 | 0.065 | 0.220 | 0.066 |
| 12 | PXM | 1 | BDT | 1 | 0.055 | 0.206 | 0.059 |
| 13 | BPO | 8 | BTF | 6 | 0.032 | 0.235 | 0.033 |
| 14 | PBIF | 6 | BTF | 8 | 0.030 | 0.200 | 0.030 |
| 15 | POZ | 1 | BTF | 2 | 0.051 | 0.314 | 0.052 |
| 16 | DCP | 2 | BTF | 4 | 0.082 | 0.332 | 0.077 |
| 17 | PBZ | 3 | BTF | 2 | 0.077 | 0.297 | 0.072 |
| 18 | PXM | 5 | BTF | 3 | 0.065 | 0.260 | 0.069 |
| 19 | PBIF | 2 | AST | 4 | 0.078 | 0.254 | 0.069 |
| 20 | POZ | 3 | TSP | 3 | 0.101 | 0.283 | 0.098 |
| 21 | PBZ | 3 | EEP | 2.5 | 0.049 | 0.311 | 0.052 |
| 22 | BPO | 3 | MDS | 2 | 0.072 | 0.340 | 0.075 |
| 23 | PBIF | 4 | NDO | 3 | 0.126 | 0.326 | 0.132 |
| 24 | BPO | 3 | NDO | 3 | 0.180 | 0.305 | 0.111 |
| 25 | PBIF | 4 | NDS | 5 | 0.099 | 0.297 | 0.102 |
| 26 | POZ | 3 | NDS | 2 | 0.098 | 0.278 | 0.099 |
| 27 | PBIF | 3 | AMS | 3 | 0.135 | 0.403 | 0.143 |
| 28 | PBO | 3 | AMS | 4 | 0.129 | 0.390 | 0.128 |
| 29 | PBIF | 1.5 | HMS | 1 | 0.142 | 0.422 | 0.135 |
| 30 | PBZ | 4 | HMS | 6 | 0.101 | 0.365 | 0.100 |
| 31 | PBIF | 5 | SMP | 5 | 0.095 | 0.308 | 0.098 |
| 32 | PBIF | 4 | MNS | 4 | 0.092 | 0.277 | 0.094 |
| 33 | PBIF | 6 | BBP | 2 | 0.174 | 0.335 | 0.120 |
| 34 | POZ | 4 | BBP | 3 | 0.135 | 0.304 | 0.098 |
| 35 | DCP | 3.5 | BBP | 3 | 0.142 | 0.350 | 0.087 |
| 36 | PBIF | 3 | BBT | 2 | 0.100 | 0.103 | 0.089 |
| 37 | DCP | 3 | BBT | 3 | 0.132 | 0.101 | 0.099 |
| 38 | BPO | 2 | BBT | 2 | 0.153 | 0.128 | 0.105 |
| 39 | PBIF | 3.5 | BBF | 3 | 0.089 | 0.084 | 0.072 |
| 40 | PBZ | 2 | BBF | 2.5 | 0.052 | 0.079 | 0.048 |
| 41 | PXM | 4 | BBF | 3 | 0.047 | 0.088 | 0.056 |
| 42 | PBIF | 8 | BBB | 6 | 0.074 | 0.141 | 0.100 |
| 43 | POZ | 5 | BBB | 4 | 0.083 | 0.179 | 0.096 |
| 44 | PXM | 4 | BBB | 3.5 | 0.069 | 0.168 | 0.091 |
| 45 | PBIF | 2 | TMT | 2 | 0.153 | 0.514 | 0.055 |
| 46 | POZ | 3 | TMT | 4 | 0.072 | 0.396 | 0.038 |
| 47 | PBZ | 2.5 | TMT | 3 | 0.068 | 0.401 | 0.042 |
| 48 | PBIF | 8 | MPT | 6 | 0.027 | 0.199 | 0.100 |
| 49 | POZ | 5 | MPT | 3 | 0.065 | 0.203 | 0.075 |
| 50 | PXM | 3 | MPT | 3 | 0.072 | 0.214 | 0.080 |

TABLE 2

Results of Light Sensitivity Test

| Comparative Example | Photo Polymerization Initiator (parts) | | Integration Light Energy (mJ/cm²) | | Laser Light λ = 488 nm |
|---|---|---|---|---|---|
| | | | λ = 488 nm | λ = 365 nm | |
| 1 | BIPE | 4 | * | 5 | * |
| 2 | BP | 3 | * | 10 | * |
| 3 | MK | 4.5 | 45,000 | 4 | 39,000 |
| 4 | 1,2-BA | 3 | 5,300 | 12 | 6,000 |
| 5 | TAQ | 4 | 780 | 25 | 650 |
| 6 | TPT | 4 | 80 | 130 | 90 |
| 7 | BDT | 4 | 120 | 143 | 130 |
| 8 | BTF | 4 | 220 | 152 | 200 |
| 9 | BPO | 4 | * | 510 | * |
| 10 | PBIF | 5 | * | 720 | * |
| 11 | POZ | 3 | * | 590 | * |
| 12 | DCP | 4 | * | * | * |
| 13 | PBZ | 4 | * | 455 | * |
| 14 | PXM | 5 | * | * | * |

Note
*means hardening was not caused even if exposed to light of 50,000 mJ/cm².

The abbreviated words in Table 1 and Table 2 are as follows.

Organic Peroxide

BPO: Benzoyl peroxide
PBIF: Di-tertiary butyl diperoxyisophthalate
POZ: 2,5-Dimethyl-2,5-di(benzoyl peroxy)hexane DCP: Dicumyl peroxide
PBZ: Tertiary butyl peroxybenzoate 1,2-BA: 1,2-Benzanthraquinone
TAQ: Thioacridone

TABLE 3

Results of Light Sensitivity Test

| Example | Photo Polymerization Initiator Composition | | | | Binder | Integration Light Energy (mJ/cm$^2$) | | |
|---|---|---|---|---|---|---|---|---|
| | Organic Peroxide (parts) | | Compound of the General Formula (I) (parts) | | | $\lambda$ = 488 nm | $\lambda$ = 365 nm | Laser Light $\lambda$ = 488 nm |
| 51 | PBIF | 4 | BTF | 3 | PMMA | 0.82 | 1.75 | 0.80 |
| 52 | PBIF | 3 | TPT | 4 | " | 0.76 | 1.84 | 0.77 |
| 53 | BPO | 6 | BTF | 4 | " | 0.68 | 1.55 | 0.65 |
| 54 | PBIF | 4 | TPT | 3 | PS | 0.91 | 1.87 | 0.97 |
| 55 | POZ | 3 | BTF | 3 | " | 0.97 | 1.90 | 0.90 |
| 56 | DCP | 3 | BTF | 5 | " | 0.88 | 1.80 | 0.92 |
| 57 | PBIF | 4 | AST | 2 | PVAc | 1.02 | 1.99 | 0.99 |
| 58 | BPO | 3 | TPT | 3 | " | 0.86 | 1.77 | 0.88 |
| 59 | PBZ | 2 | BTF | 2 | " | 0.99 | 2.01 | 1.00 |

PMMA: Polymethyl methacrylate,
PS: Polystyrene,
PVAc: Polyvinyl acetate
Note
The abbreviated words in Table 3 are the same meaning as in Table 1.
The amount of the binders is 100 parts.

PXM: α,α'-Bis(tertiary butyl peroxyisopropyl)benzene

Pyrylium Salt

TPT: 2,4,6-Triphenylthiapyrylium perchlorate
BDT: 4-(4-Butoxyphenyl)-2,6-diphenylpyrylium perchlorate
BTF: 4-(4-Butoxyphenyl)-2,6-bis(4-methoxyphenyl)-thiapyrylium fluoroborate
AST: 6-(4-Dimethylaminostyryl)-2,4-diphenyl-thiapyrylium perchlorate
TSP: 2,4,6-Triphenylselenopyrylium perchlorate
EPP: 2,6-Bis(4-ethylphenyl)-4-(4-methoxyphenyl)-pyrylium fluoroborate
MDS: 6-(4-Methoxyphenyl)-2,4-diphenyl-selenopyrylium perchlorate
NDO: 2-Nitro-4,6-bis(4-dimethylaminostyryl)pyrylium fluoroborate
NDS: 2-Nitro-4,6-bis(4-dimethylaminostyryl)-thiapyrylium fluoroborate
AMS: 2-Amino-4,6-bis(4-methoxy-β-ethylstyryl)-thiapyrylium fluoroborate
HMS: 2-Hydroxy-4,6-bis(4-dimethylamino-β-methoxystyryl)thiapyrylium perchlorate
SMP: 4-(4-Dimethylaminostyryl)-6-[β,β-bis(4-dimethylaminophenyl)vinylene]thiapyrylium perchlorate
MNS: 2-Methoxy-4-naphthyl-6-styrylthiapyrylium fluoroborate
BBP: 4-(4-Butoxyphenyl)-2,6-diphenylthiapyrylium perchlorate
BBT: 4-(4-Butoxyphenyl)-2,6-diphenylthiapyrylium fluoroantimonate
BBF: 4-(4-Butoxyphenyl)-2,6-diphenylthiapyrylium fluorophosphonate
BBB: 4-(4-Butoxyphenyl)-2,6-diphenylthiapyrylium fluoroborate
TMT: 2,4,6-Tri(4-methoxyphenyl)thiapyrylium perchlorate
MPT: 2,6-Bis(4-methoxyphenyl)-4-phenylthiapyrylium fluoroborate

Known Photo Polymerization Initiator

BIPE: Benzoin isopropyl ether
BP: Benzophenone
MK: Michler's ketone

Tables 1, 2 and 3 clearly show that materials in Examples all have very high sensitivity to ultraviolet light and visible light as compared with those of the Comparative Examples. Particularly, materials shown in Table 1 using poly-N-vinylpyrrolidone as a binder have surprisingly high sensitivity to visible light having a wavelength of 488 nm on the order of 0.1 mJ/cm$^2$ or less.

Accordingly, the photo polymerization initiator compositions of the present invention can be widely applied to various light-sensitive materials. The invention is particularly suitable for use with materials which require high sensitivity characteristics, for example, light-sensitive materials for visible light laser.

While the invention has been described in detail and with reference to specific embodiments thereof, it will be apparent to one skilled in the art that various changes and modifications can be made therein without departing from the spirit and scope thereof.

What is claimed is:

1. A photo polymerization initiator composition, comprising:
an organic peroxide; and
a salt selected from the group consisting of pyrylium salts, thiapyrylium salts and selenopyrylium salts represented by the general formula (I):

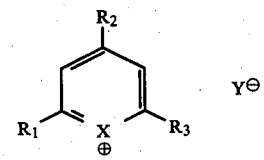

wherein R$_1$, R$_2$ and R$_3$ independently represent a hydrogen atom, an alkyl group, a haloalkyl group, an ethylenyl group, a styryl group, an alkoxy group, a phenyl group, a naphthyl group, an alkylphenyl group, an alkoxyphenyl group, a hydroxyphenyl group, a halophenyl group, a nitrophenyl group, an aminophenyl group, a nitro group, an amino group or a hydroxyl group, X represents an oxygen atom, a sulfur atom or a selenium atom, and Y represents an anion functional group.

2. A photo polymerization initiator composition as claimed in claim 1, further comprising:
a binder.

3. A photo polymerization initiator composition as claimed in claim 2, wherein the binder is a polymer containing a repeating unit of N-vinylpyrrolidone.

4. A photo polymerization initiator composition as claimed in claim 1, wherein X is an oxygen atom.

5. A photo polymerization initiator composition as claimed in claim 1, wherein X is a sulfur atom.

6. A photo polymerization initiator composition as claimed in claim 1, wherein X is a selenium atom.

7. A photo polymerization initiator composition as claimed in claim 1, wherein at least one of the $R_1$, $R_2$ and $R_3$ represents a benzene ring-containing group selected from the group consisting of s styryl group, a phenyl group, a naphthyl group, an alkylphenyl group, an alkoxyphenyl group, a hydroxyphenyl group, a halophenyl group, a nitrophenyl group, and an aminophenyl group.

8. A photo polymerization initiator composition as claimed in claim 7, wherein $R_1$, $R_2$ and $R_3$ are each a benzene ring-containing group selected from the group consisting of a styryl group, a phenyl group, a naphthyl group, an alkylphenyl group, an alkoxyphenyl group, a hydroxyphenyl group, a halophenyl group, a nitrophenyl group, and an aminophenyl group.

9. A photo polymerization initiator composition as claimed in claim 8, wherein $R_1$, $R_2$ and $R_3$ are each an alkylphenyl group, an alkoxyphenyl or a phenyl group.

10. A photo polymerization initiator composition as claimed in claim 1, wherein Y is perchlorate, fluoroborate, chloroalminate, chloroferrate, sulfur acetate, methosulfate, thiocyanate, sulfate, nitrate, fluoroantimonate, fluorophosphonate, or acetate.

11. A photo polymerization initiator composition as claimed in claim 1, wherein Y is selected from the group consisting of perchlorate and fluoroborate.

12. A photo polymerization initiator composition as claimed in claim 1 wherein the ratio of the organic peroxides to the compounds represented by the formula (I) is 1 to 99:99 to 1.

13. A photo polymerization initiator composition as claimed in claim 12, wherein the ratio is 3 to 95:97 to 5.

14. A photo polymerization initiator composition as claimed in claim 2, wherein the binder has a molecular weight in the range of 1,000 to 1,000,000.

15. A photo polymerization initiator composition as claimed in claim 14, wherein the binder has a molecular weight in the range of 3,000 to 500,000.

16. A photo polymerization initiator composition as claimed in claim 3, wherein the N-vinylpyrrolidone is present in the binder in an amount of 5% by weight or more.

17. A photo polymerization initiator composition as claimed in claim 3, wherein the amount of the polymer containing a repeating unit of N-vinylpyrrolidone is 1 to 100 parts by weight based on 1 part by weight of the total of the organic peroxide and the compound represented by the formula (I).

18. A photo polymerization initiator composition as claimed in claim 1, wherein the total amount of the organic peroxide and the compound represented by the formula (I) is 0.1 to 40 parts by weight based on 100 parts by weight of a polymerizable ethylenically unsaturated compound.

19. A photo polymerization initiator composition as claimed in claim 2, wherein the total amount of the organic peroxide, the compound represented by the formula (I) and the binder is 50 to 200 parts by weight based on 100 parts by weight of the polymerizable ethylenically unsaturated compound.

20. A photo polymerization initiator composition as claimed in claim 1, wherein the organic peroxide is a benzoyl group-containing organic peroxide.

* * * * *